United States Patent [19]

Sparks

[11] Patent Number: 5,719,069

[45] Date of Patent: Feb. 17, 1998

[54] ONE-CHIP INTEGRATED SENSOR PROCESS

[75] Inventor: Douglas Ray Sparks, Kokomo, Ind.

[73] Assignee: Delco Electronics Corporation, Kokomo, Ind.

[21] Appl. No.: 571,627

[22] Filed: Dec. 13, 1995

Related U.S. Application Data

[63] Continuation of Ser. No. 305,550, Sep. 14, 1994, abandoned.

[51] Int. Cl.$^6$ .................................................... H01L 21/70
[52] U.S. Cl. .................... 437/59; 437/51; 437/228; 437/974; 148/DIG. 135
[58] Field of Search ..................... 437/51, 59, 901, 437/228, 974, 225; 148/DIG. 135, DIG. 159

[56] References Cited

U.S. PATENT DOCUMENTS

| | | | |
|---|---|---|---|
| 4,977,101 | 12/1990 | Yoder et al. | 437/901 |
| 5,145,810 | 9/1992 | Matsumi | 437/901 |
| 5,296,730 | 3/1994 | Takano et al. | 437/901 |
| 5,320,705 | 6/1994 | Fujii et al. | 437/901 |
| 5,326,726 | 7/1994 | Tsang et al. | 437/901 |

FOREIGN PATENT DOCUMENTS

| | | | |
|---|---|---|---|
| 34 19 710 | 11/1984 | Germany. | |
| 0061374 | 3/1987 | Japan | 437/901 |
| 0098156 | 4/1988 | Japan | 437/901 |
| 0132843 | 5/1990 | Japan | 437/901 |

OTHER PUBLICATIONS

Technische Rundschau, vol. 81, No. 35, Sep. 1, 1989 Bern CH, pp. 100–105, H. A. Kayal et al, "Anwendungsspezifische Intelligente Sensoren—Mechatronik En Miniature".

U.S. Pat. Application SN 08/059,222 to Sparks et al., Filed on May 10, 1993.

*Primary Examiner*—Tuan H. Nguyen
*Attorney, Agent, or Firm*—Jimmy L. Funke

[57] ABSTRACT

A method for concurrently forming a micromachine element and an integrated circuit device on the same substrate, such that fabrication of the micromachine element and the circuit device requires a minimal number of processing steps. The method is adapted for forming sensing devices, such as accelerometers and pressure sensors, which utilize a small micromachine element, such as a bridge, cantilevered beam, suspended mass, membrane or capacitive element that is supported over a cavity formed in the silicon substrate. Piezoresistors used to detect the deflection of the micromachine element are formed simultaneously with elements of the integrated circuit devices, such that a minimal number of processing steps are required.

19 Claims, 3 Drawing Sheets

ONE-CHIP INTEGRATED SENSOR PROCESS

This is a continuation of application Ser. No. 08/305550 filed on 14 Sep. 1994, now abandoned.

The present invention generally relates to bulk micromachining processes used to form integrated circuit devices on or under the surface of a silicon wafer. More particularly, this invention relates to an improved method for micromachining integrated sensor elements on the surface of a silicon wafer which incorporates bipolar, CMOS or BiCMOS devices, in which the processes by which the micromachine elements are formed are fully integrated into the bipolar, CMOS or BiCMOS process.

BACKGROUND OF THE INVENTION

Techniques for bulk micromachining silicon wafers are well known in the semiconductor arts. Generally, this process involves forming semiconductor devices in a silicon wafer by etching the bulk silicon at the surface of the wafer, in contrast to etching methods in which semiconductor devices are formed by selectively etching layers which were previously deposited on the surface of the wafer substrate. Bulk micromachining can be used to form micromachined features in the surface of a silicon substrate from which sensing elements can be formed.

Bulk micromachine sensing elements are generally superior to sensing elements formed by etching deposited layers, in that less warpage occurs with bulk micromachine elements, thereby enhancing the accuracy of the sensing device. Sensors fabricated by bulk micromachining methods are also often preferred to those fabricated by known stacked-wafer techniques, in that the residual stresses and stress concentrators common to stacked-wafer sensors can generally be avoided.

An example of a bulk micromachining method is taught by U.S. patent application Ser. No. 08/059,222 (Attorney Docket No. G-10019) to Sparks et al., which teaches a method which encompasses a minimal number of processing steps. The method is particularly suitable for forming a sensing device that includes a small micromachine element, such as a bridge, cantilevered beam, suspended mass, membrane or capacitive element, which is supported over a cavity formed in a silicon substrate. The method enables the formation of a wide variety of sensing devices on a single silicon wafer, as well as enables the device to be formed adjacent and on the same substrate as an integrated circuit used to process the signals from the device. As a result, the process taught by Sparks et al. enables a sensing device to be up-integrated with its processing circuitry.

However, the teachings of Sparks et al. do not provide for a method by which a micromachined sensing element can be fabricated concurrently with an integrated circuit on a single chip. While the additional steps required to form an integrated circuit prior to or subsequent to the formation of the micromachine element are generally conventional, it is a continuous objective in the semiconductor industry to minimize the number of processing steps necessary to form any given device.

Thus, it would be desirable to provide an improved method for forming small, integrated micromachine elements in a silicon wafer using a bulk micromachining process, in which the method includes concurrently forming an integrated circuit device on the same silicon wafer, such that the method significantly reduces the number of processing steps necessary to form the micromachine element and its corresponding integrated circuitry.

SUMMARY OF THE INVENTION

It is an object of this invention to provide an improved method for bulk micromachining a silicon wafer for purposes of forming a small micromachine element within the silicon wafer, wherein the micromachine element is suitable for use as a component of a semiconductor sensing device.

It is a further object of this invention that such a method require a minimal number of processing steps to form the micromachine element, while simultaneously enabling an integrated circuit device to be concurrently formed on the same silicon wafer.

It is still a further object of this invention that such a method be conducive to forming various types of sensing devices having a wide variety of physical configurations.

In accordance with a preferred embodiment of this invention, these and other objects and advantages are accomplished as follows.

According to the present invention, there is provided a method for concurrently forming a micromachine element and an integrated circuit device on the same substrate, such that fabrication of the micromachine element and the circuit device requires a minimal number of processing steps. More particularly, this method is adapted for forming sensing devices, such as accelerometers and pressure sensors which utilize a small micromachine element, such as a bridge, cantilevered beam, suspended mass, membrane or capacitive element, that is supported within or above a cavity formed in the silicon substrate.

In accordance with a preferred aspect of this invention, piezoresistors used to detect the deflection of the micromachine element are formed simultaneously with elements of the integrated circuit devices, such that a minimal number of processing steps are required to form a one-chip integrated sensing device.

Generally, as applied to bipolar processes, the method of this invention involves forming an N-type epitaxial silicon layer on a first surface of a suitable substrate, and then simultaneously growing a first field oxide layer on the epitaxial silicon layer and a second field oxide layer on the opposite surface of the substrate. Since piezoresistive sensing elements are preferably formed by this method, the substrate is preferably formed from a [100] p-type wafer. If the circuit device being formed is an NPN bipolar transistor, the epitaxial silicon layer forms the collector for the circuit device. If the circuit device being formed is a lateral PNP bipolar transistor, the epitaxial silicon layer serves to form the base for the circuit device.

Two or more P+ regions are then formed in the epitaxial silicon layer so as to form another element of the integrated circuit device and one or more piezoresistors for the micromachined sensing element. If the circuit device being formed is an NPN transistor, one of the P+ regions forms a base of the circuit device. If the circuit device being formed is a lateral PNP transistor, two P+ regions serve to form the emitter and collector for the circuit device. An N+ region is then formed in the epitaxial silicon layer so as to form yet another element of the integrated circuit device—an emitter within the base formed by one of the P+ regions if the circuit device is an NPN transistor, or alternatively, a base contact within the epitaxial silicon layer if the circuit device is a lateral PNP transistor.

Contacts and conductors can then be formed in a conventional manner for the micromachine element and the integrated circuit device on the first field oxide layer. A cavity is then defined through the second field oxide and in the opposite surface of the substrate, so as to form the micromachine element above or within the cavity.

For the bipolar process, an additional and preferred step of this method includes forming isolation diffusions in the epitaxial silicon layer and between the micromachine element and the integrated circuit device prior to forming the P+ regions, for the purpose of electrically isolating the two devices. The substrate is preferably bonded to a wafer which preferably covers the cavity in the surface of the substrate and, if an absolute pressure sensor is formed by the micromachine element, hermetically seals the cavity.

In view of the above, it can be seen that the present invention encompasses a novel method by which micromachine process can be fully integrated with a integrated circuit process by a technique in which the sensor's piezoresistors and the integrated circuit device's base are formed simultaneously. The present method is particularly adapted for forming micromachine sensing elements concurrently with bipolar processes, resulting in a fully integrated fabrication process requiring a minimal number of processing steps. Modifications of the processing steps allow the invention to be readily adapted to CMOS and BiCMOS processes as well.

The present invention offers additional advantages. For example, the thickness of the epitaxial silicon layer can be varied to correspondingly affect the thickness of the micromachine element. The thickness of the micromachine element can be further tailored by forming one or more buried layers in the surface of a substrate. For example, use of an N+ buried layer will locally restrict the formation of the cavity when using an etchant which preferentially attacks P-doped silicon, such that the thickness of the micromachine element will be greater at the N+ buried layer than in the surrounding region. In contrast, a P+ buried layer will be preferentially etched, such that the thickness of the micromachined sensing structure will be correspondingly decreased where the P+ buried layer was formed. As a result, the size and shape of the cavity can be accurately defined by appropriately defining the size and location of the buried layer. Consequently, the configuration of the micromachine element can also be accurately predetermined, permitting the fabrication of an accurate sensing device.

Other objects and advantages of this invention will be better appreciated from the following detailed description.

BRIEF DESCRIPTION OF THE DRAWINGS

The above and other advantages of this invention will become more apparent from the following description, particularly when taken in conjunction with the accompanying drawings, in which.

DETAILED DESCRIPTION OF THE INVENTION

A method is provided by which a micromachine element can be accurately bulk micromachined in the surface of a silicon wafer concurrently with the fabrication of an integrated circuit device on the same substrate, such that a minimal number of processing steps are required to form a one-chip integrated sensor. Sensors which can be formed in accordance with the method of this invention include piezoresistive pressure sensors and capacitive accelerometers, such as those illustrated in FIGS. 1 and 4, respectively, as well as piezoresistive accelerometers, though the bulk micromachining process of this invention is generally applicable to the formation of essentially any micromachine element, such as a bridge, membrane, suspended mass, cantilevered beam or capacitive sensing element, at or under the surface of a silicon wafer. For clarity, the following description makes primary reference to the processing of the pressure sensor 10 shown in FIG. 1, while comments concerning the accelerometer 110 of FIG. 4 will be limited to the processing steps which differ from that of the pressure sensor 10.

In addition, this invention generally encompasses the concurrent processing of a sensor and its control and temperature-compensating circuitry on a single substrate. The following description will focus on a bulk micromachining process which is integrated with a bipolar process. However, from the following discussion, those skilled in the art will appreciate the manner in which the method of this invention can be extended to the integration of various types of sensors with both CMOS and BiCMOS processes.

Figure 1:
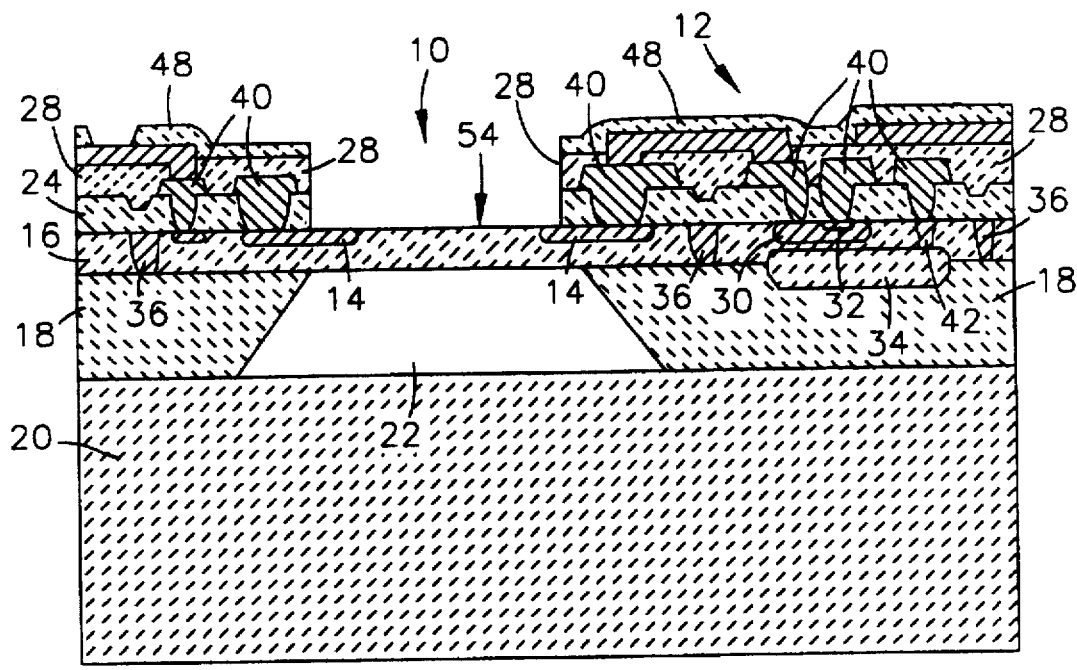
FIG. 1 illustrates a one-chip piezoresistive pressure sensing device which is fabricated in accordance with this invention.

Referring to FIG. 1, the pressure sensor 10 is a piezoresistive pressure sensor, utilizing a number of piezoresistors 14 formed in an epitaxial silicon layer 16. The piezoresistors 14 serve as the sensing elements for the sensor's micromachine element 54. As shown, the micromachine element 54 is a pressure sensing membrane composed of the epitaxial layer 16, an optional passivation layer, and an optional interlevel dielectric layer 28. Also as shown, the piezoresistors 14 are diffused piezoresistors formed in the epitaxial layer 16 in accordance with known methods.

The sensor 10 is formed on the same substrate 18 as its control and compensation circuitry, which is illustrated here to include an NPN bipolar transistor 12. As is known in the art, P+ isolation diffusion 36 can be formed in the epitaxial layer 16 for junction isolation of the sensor 10 and transistor 12, while a deep N+ diffusion 42 can be formed in the epitaxial layer 16 to lower the collector resistance of the transistor 12. The substrate 18 is bonded to a glass or silicon wafer 20, such that a cavity 22 formed in the substrate 18 forms a chamber beneath the sensing membrane of the pressure sensor 10. As shown in FIG. 1, the wafer 20 hermetically seals the cavity 22, such that the sensor 10 is an absolute pressure sensor. Alternatively, a hole could be provided through the wafer 20 to vent the cavity 22, such that the sensor 10 would be a differential pressure sensor capable of measuring a pressure difference between the front and backside of the sensor 10.

The epitaxial layer 16 serves as the collector for the NPN bipolar transistor 12, while a P+ region forms the transistor's base 30 and an N+ region within the base 30 forms the transistor's emitter 32. In accordance with this invention, the P+ mask and etch process which forms the base 30 is used to simultaneously form the piezoresistors 14, such that two mask, etch and doping steps are Combined into one. In addition, the N+ region which forms the emitter 32 also provides an ohmic contact for subsequent electrochemical etching steps.

The method of this invention provides for the efficient processing of both the sensor 10 and the transistor 12 on the same chip by uniquely combining sensor and circuit processing steps, such that as few as seven masking levels are required to fabricate an integrated sensor. Electrochemical etching (ECE) is preferably used to produce the etched devices in the integrated process. Preferred circuits formed by the method of this invention are electrically programmable at the package level for trimming without the need for laser trimming or wafer probe fuse blowing.

In accordance with this invention, a preferred method for forming the pressure sensor 10 and NPN transistor 12 of FIG. 1 is represented in FIGS. 2a through 2e. The process flow begins with a [100] p-type wafer which is polished on both the frontside and backside surfaces. As used here, the frontside of the wafer refers to the surface of a substrate 18 on which the sensor 10 and transistor 12 are to be fabricated, while the backside of the wafer refers to the opposite surface of the substrate 18 through which the cavity 22 is to be formed.

Preferably, the wafer is thinner than is conventional so as to reduce the time required for the bulk micromachining process, yet is sufficiently thick so as to permit handling, while the lateral dimensions of the wafer are generally large enough such that it can be subsequently diced into a number of individual chips. As an example, a suitable thickness for a 125 millimeter diameter wafer is about 0.38 to about 0.50 millimeter (about 0.015 to about 0.020 inch). As known to those skilled in the art, a [100] substrate 18 is essential for the formation of the piezoresistors 14. The substrate 18 is lightly-doped with a suitable dopant, such as the ions of boron or another trivalent element, so as to have a suitable acceptor concentration, as is also known in the art.

Figure 2A:
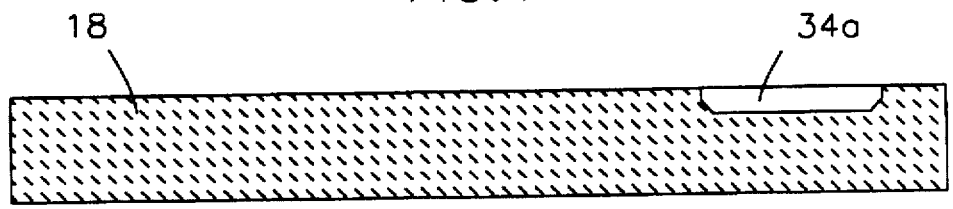
FIGS. 2a through 2e illustrate an improved bulk micromachining process by which a micromachine element is fabricated concurrently with a bipolar integrated circuit on the same substrate, so as to form the pressure sensing device of FIG. 1 in accordance with a preferred method of this invention.

Preferably, the substrate 18 is laser scribed to aid in the dicing of the substrate 18 into a number of chips. Thereafter, the substrate 18 undergoes an initial oxidation, as is conventional. As shown in FIG. 2a, an N+ region 34a may then be formed in the surface of the substrate 18, to eventually become an N+ buried layer 34 shown in FIG. 2b. The N+ buried layer 34 is desirable for the purpose of lowering the collector resistance of the transistor 12. The N+ buried region 34a can be formed using various suitable techniques known to those skilled in the art, such as with a spin-on technique to deposit ions of arsenic, phosphorous, antimony or another pentavalent element on the substrate 18, followed by a high temperature drive to diffuse the doping ions into the substrate 18. As will be apparent to those skilled in the art, the inclusion of the N+ buried layer 34 in the substrate 18 is compatible with both bipolar and BiCMOS processes, which typically include an N+ buried layer under an epitaxial silicon layer.

Figure 3A:
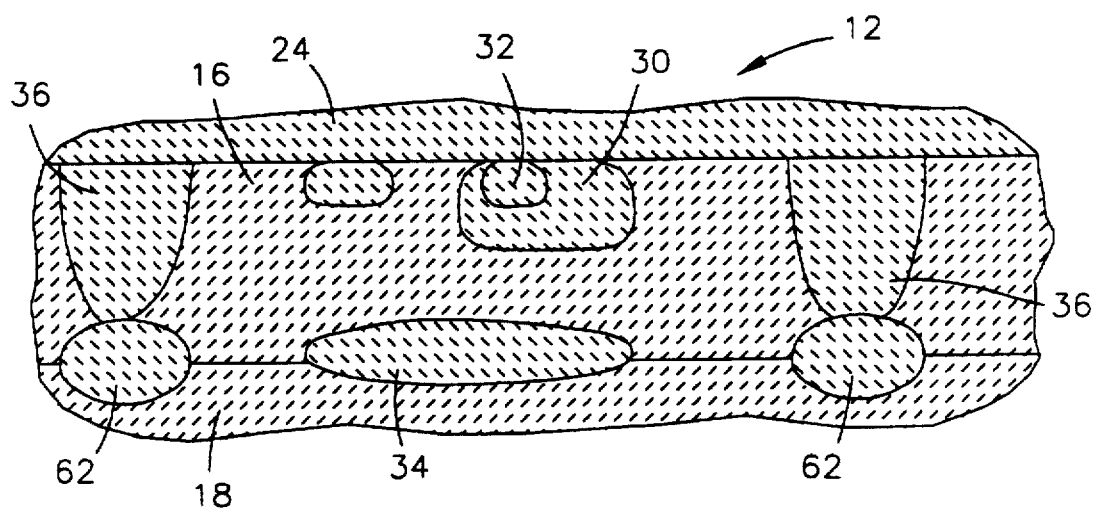
FIGS. 3a and 3b illustrate the use of buried layers in the bipolar integrated circuit and the micromachine element, respectively, in accordance with a preferred aspect of this invention.

FIG. 3a further illustrates the use of buried layers with the transistor 12, including the N+ buried layer 34 noted above and a pair of P+ buried layers 62. As with the N+ buried layer 34, the P+ buried layers 62 are also formed in the surface of the substrate 18 prior to growing the epitaxial layer 16. As shown, the P+ buried layers 62 are each disposed beneath an isolation diffusion 36 for the purpose of providing junction isolation for thicker epitaxial layers 16. As will be discussed below with reference to FIG. 3b, N+ and P+ buried layers can also be formed for the purpose of tailoring the dimensional characteristics of the sensor's micromachine element.

Figure 2B:
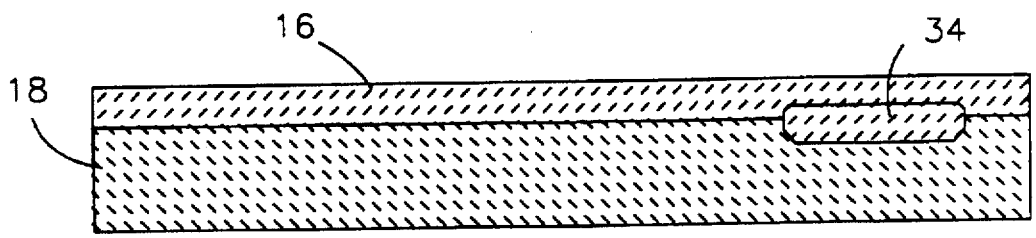

Whether or not N+ or P+ regions are formed in the substrate 18, fabrication of the sensor 10 and transistor 12 continues with the deposition of the epitaxial layer 16 on the frontside of the substrate 18, as shown in FIG. 2b. In so doing, the epitaxial layer 16 buries the N+ region 34a shown in FIG. 2a, thus establishing the N+ buried layer 34. As noted before, the epitaxial layer will form the collector for the NPN transistor 12, and as such, is lightly doped n-type. The epitaxial layer 16 can be formed in a conventional manner, with its thickness being tailored to the particular requirements of the application, though preferably on the order of about 5 to about 18 micrometers, and more preferably about 11.5 to about 13.5 micrometers in thickness, yielding a resistivity of about 1.0 to about 1.8 ohm-centimeters.

Figure 2C:
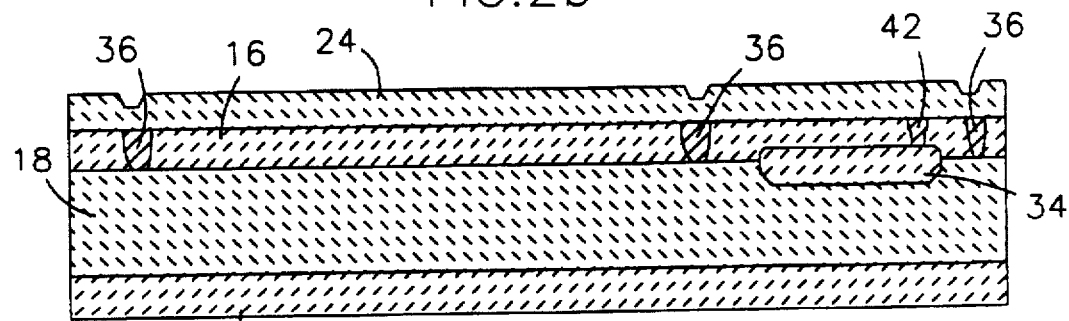

Referring now to FIG. 2c, a field oxide layer 24 is grown or deposited in a conventional manner on the epitaxial layer 16. The field oxide layer 24 can be between about 5000 A and about 10,000 A thick, which is sufficient to provide a protective layer for the epitaxial layer 16 during the subsequent etching process in which the P+ isolation diffusions 36 are formed. The field oxide layer 24 can be conventionally patterned using a photoresist mask, and then etched to selectively remove the field oxide layer 24 from each surface region of the epitaxial layer 16 which corresponds to the desired placement of the diffusions 36.

The P+ isolation diffusions 36 can be formed using various suitable techniques known to those skilled in the art, such as by known deposition and diffusion techniques. For example, boron can be deposited using boron nitride solid source doping or ion implanting. Thereafter, a high temperature drive is used to diffuse the boron dopant into the substrate 18 and thereby form the diffusions 36. The deep N+ diffusion 42 can also be formed at this time using a similar technique with an appropriate n-type dopant.

Advantageously, the high temperature drive required to form the P+ isolation diffusions 36 and the deep N+ diffusion 42 simultaneously grows a thick field oxide layer 38 on the backside of the substrate 18. The field oxide layer 38 preferably has a thickness on the order of about 15,000 A, and will later serve as part of an etch mask during etching of the cavity 22. This field oxide layer 38 will require protection during any wet oxide etching steps, such as those used to form the base 30 and emitter 32 for the transistor 12, as well as contacts for the sensor 10 and transistor 12.

The mask and etch for the piezoresistors 14 and the base 30 are then performed. As with the formation of the diffusions 36, the piezoresistors 14 and base 30 can be doped using a diffusion process or an implant. An optimum method is to use a photoresist mask to selectively remove the field oxide layer 24 from each surface region of the epitaxial layer 16 which corresponds to the desired placement of the piezoresistors 14 and the base 30, followed by a conventional pre-implant oxidation step so as to form an oxide layer (not shown) having a thickness of about 500 A to about 1000 A. Thereafter, boron is ion implanted at 120 KeV and a dosage of about $1 \times 10^{14}$ atoms/cm$^2$. At this level, the implanted boron will produce a resistance of approximately 200 to 400 ohms/square, which is suitable for both the piezoresistors 14 and the base 30.

Figure 2D:
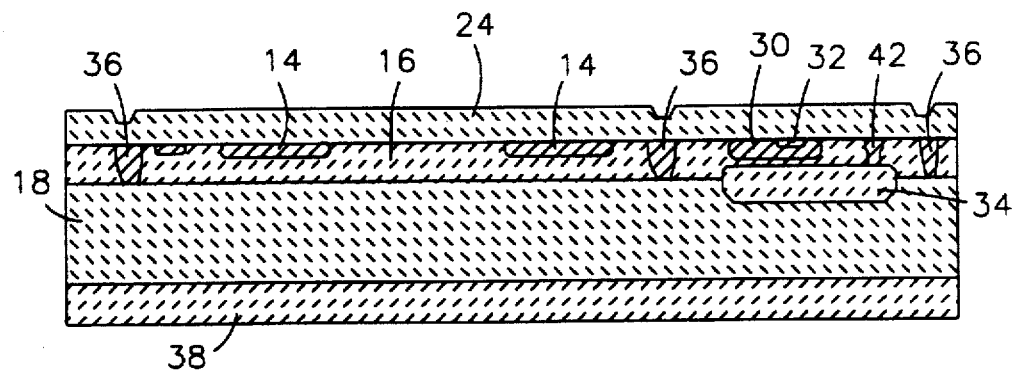

A diffusion of about 850° to about 1000° C. is then used to diffuse the boron dopant into the substrate 18 and thereby form the piezoresistors 14 and the base 30, as shown in FIG. 2d. Importantly, the above technique combines the two mask, etch and doping steps for the piezoresistors 14 and base 30 into a single mask, etch and doping step, so as to integrate the fabrication of the sensor 10 with the bipolar process of the transistor 12.

At this point, circuit resistors (not shown) can be formed on the surface of the substrate 18 using conventional processing techniques. The circuit resistors formed exhibit high resistance, on the order of about 2000 to about 10,000 ohms/square. Preferably, the circuit resistors are not oriented along the [110] direction like the piezoresistors 14, but should be oriented about 45 degrees from the flat in order to minimize the affect of mechanical stresses on their performance.

Following formation of the piezoresistors 14 and the base 30, the wafer is annealed at a suitable temperature, such as about 850° C. to about 1000° C. The mask and etch for the emitter 32 are then performed. As with the formation of the piezoresistors 14 and base 30, the emitter 32 can be formed using a photoresist mask to selectively remove the field oxide layer 24 from each surface region of the epitaxial layer 16 which corresponds to the desired placement of the emitter 32, followed by doping with phosphorus or arsenic by ion implantation, solid diffusion source, or gaseous $POCl_3$ diffusion, with phosphorus being the preferred dopant.

A high temperature drive is then used to diffuse the dopant into the substrate 18 and thereby form the emitter 32, as shown in FIG. 2d. A thin field oxide layer which is simultaneously grown on the epitaxial layer 16 during diffusion of the emitter 32 can be used to form capacitors (not shown).

Figure 2E:
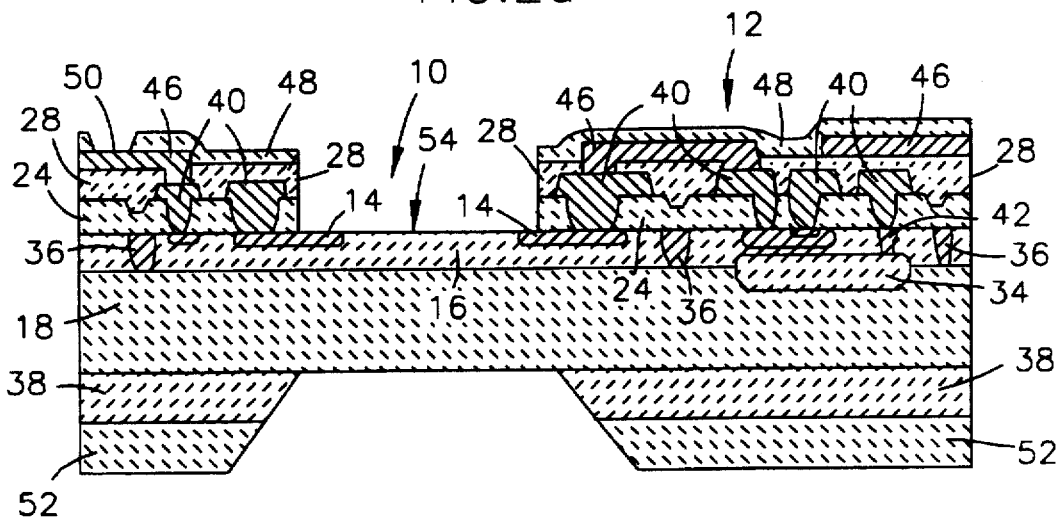

With reference now to FIG. 2e, the contacts for the sensor 10 and the transistor 12 can then be formed using conventional mask and etch techniques. The thick field oxide 24 is preferably etched from the surface of the epitaxial layer 16 in the region which will define the micromachine element 54, so as to avoid film stress effects. An aluminum metal film is then deposited, masked and etched to form interconnects 40 for the sensor 10 and transistor 12. A passivation layer may then be deposited to protect the underlying metal film and circuitry. Alternatively, and as shown in FIG. 2e, the metal film can be followed by deposition of the interlevel dielectric layer 28. Vias are then etched through the dielectric layer 28, after which a second metal film 46 can be deposited to form a second circuitry layer, so as to allow for denser circuitry on the substrate 18. This process can be repeated if additional circuitry layers are desired. The interlevel dielectric layer 28 is preferably an oxide or nitride, in that polyimide is generally incapable of withstanding the temperatures required for subsequently bonding the wafer 20 to the substrate 18. A final oxide or passivation layer 48, preferably plasma nitride, can then be formed over the metal film 46, masked and etched in a conventional manner to open metal pads 50 to the second metal film 46, so as to permit testing of the sensor 10 and transistor 12 at this level, if desired. At this point, the interlevel dielectric layer 28 and the passivation layer 48 may be removed from above the region which is to form the micromachine element 54, for the purpose of fabricating a low pressure sensor or a low-g accelerometer.

Next, a thick plasma nitride film 52, on the order of about 10,000 Å to about 15,000 Å, is deposited over the field oxide layer 38 on the backside of the substrate 18. The plasma nitride film 52 and the field oxide layer 38 are then etched, as shown in FIG. 2e, preferably with a dry etch due to the thicknesses of the layers to be etched. The backside of the substrate 18 can then be electrochemically etched to form the cavity 22 and thereby delineate the micromachine pressure sensing membrane 54 for the sensor 10, shown in FIG. 1.

A preferred electrochemical etch process uses a 20 percent KOH aqueous solution at about 88° C., using an endpoint detection system as is known in the art, though other electrochemical etching solutions could be used, such as NaOH, tetramethyl alcohol hydroxide (TMAH) and hydrazine. The preferred electrochemical etch process serves to preferentially etch the p-type silicon of the substrate 18 while stopping at the n-type epitaxial layer 16. The emitter 32 is used to make ohmic contact to the epitaxial layer 16 during the etching process.

Finally, the glass or silicon wafer 20 is bonded to the backside of the substrate 18 to enclose the cavity 22 and form a reference vacuum chamber for the sensing membrane 54 and to aid in isolating packaging stresses. As shown, the wafer 20 hermetically seals the cavity 22 to enable the sensor 10 to serve as an absolute pressure sensor though, as noted above, the cavity 22 could be vented through the wafer 20 to enable the sensor 10 to serve as a differential pressure sensor.

Thereafter, generally conventional processes can be used to complete the fabrication and implementation of the sensor 10 and transistor 12. Individual chips can be sawed from the wafer by which the substrate 18 is formed. Preferably, die attachment at packaging uses a soft adhesive such as an RTV or silicone-based glue. The adhesive preferably has a low Young's modulus to prevent packaging stresses from interacting with the sensing membrane 54. Wirebonding is then performed to link the individual chips to their packages. Solder attachment is preferably avoided to reduce stress on the sensing membrane 54. Finally, the chips are tested and programmed using any suitable method. The use of logic circuits and programmable links allow testing and programming to be performed at the package level without the use of laser or abrasion trimming, and without a previous fuse blowing operation during wafer testing.

The above processing completes the processing for the pressure sensor 10 of FIG. 1. As those skilled in the art will recognize, a lateral PNP transistor (not shown) can be fabricated along with or instead of the NPN transistor 12 shown in FIG. 1. More specifically, if the integrated circuit device is a lateral PNP bipolar transistor, the epitaxial silicon layer 16 serves to form the base for the transistor, two P+ regions are formed in the epitaxial layer 16 to define the emitter and collector, and an N+ region is then formed in the epitaxial layer 16 so as to form a base contact.

Forming an accelerometer instead of pressure sensor also entails nearly an identical process to that described above, but differs in that the process of forming the cavity 22 includes delineation of a suspended beam or mass. For a piezoresistive accelerometer (not shown), the cavity 22 is further delineated with a plasma silicon etched through the epitaxial silicon layer 16 to form a cantilevered beam which terminates in a large deflectable proof mass suspended within the cavity 22. Piezoresistors 14 are formed in the beam to detect the deflection of the beam caused by acceleration forces on the proof mass. An additional wafer can be bonded to the frontside of the substrate 18 to protect the proof mass, to improve its damping characteristics, and to act as a g-stop to prevent excessive deflection. Holes are preferably etched in the frontside wafer to allow wire bonding to the sensor 10.

Figure 4:
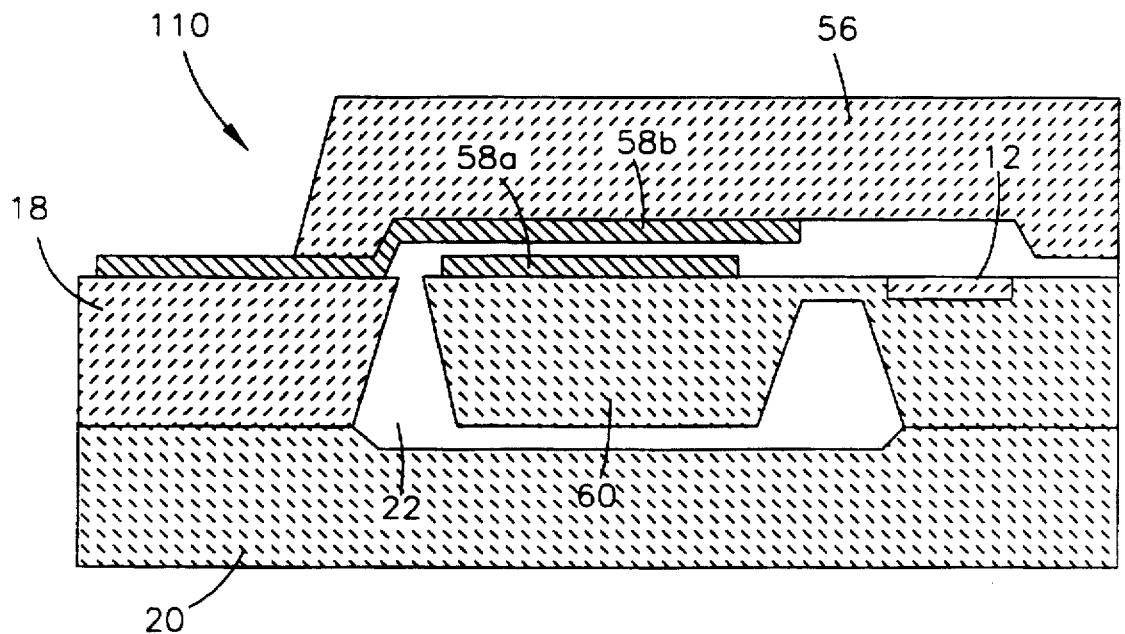
FIG. 4 illustrates a one-chip capacitive accelerometer fabricated in accordance with this invention.

For the capacitive accelerometer shown in FIG. 4, a plasma silicon etch is again used to delineate a cantilevered beam which terminates in a large deflectable proof mass 60 suspended within the cavity 22. A metal plate pattern 58a is formed on the upper surface of the proof mass 60 in a conventional manner. An additional wafer 56 which is equipped with a metal plate pattern 58b is then bonded to the frontside of the substrate 18, so as to capacitively mate the plate patterns 58a and 58b, as shown in FIG. 4, to form a capacitive sensing element. Metal-to-metal bonding can be used to bond the top wafer 56 to the substrate 18.

Figure 3B:
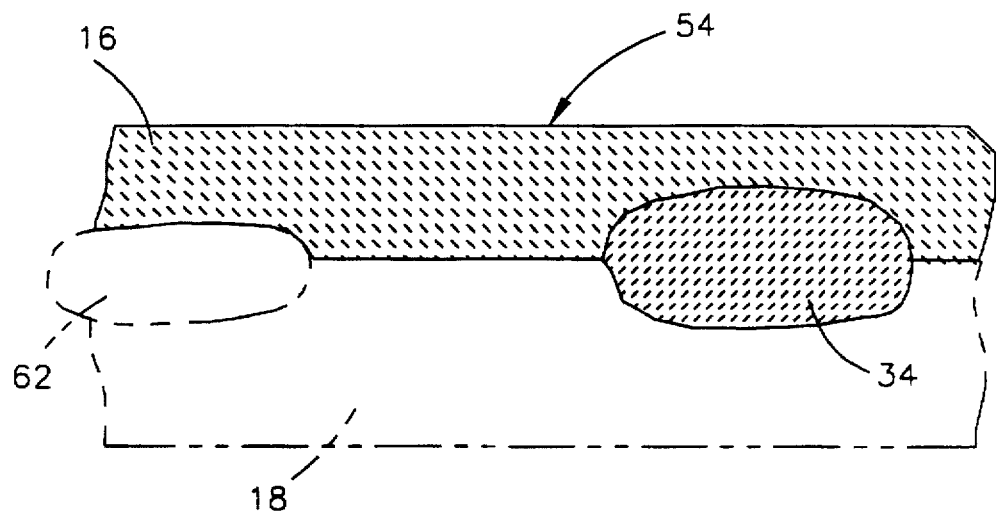

Further modifications of the processing method of this invention are illustrated in FIGS. 3a and 3b. As discussed above, FIG. 3a illustrates the manner in which the performance of the NPN transistor 12 is improved by employing buried layers beneath the epitaxial layer 16. The N+ buried layer 34 is desirable for the purpose of lowering the collector resistance of the transistor 12, while the P+ buried layers 62 serve to enhance the electrical isolation of the transistor 12 from adjacent devices on the substrate 18.

FIG. 3b illustrates the use of N+ and P+ buried layers 34 and 62 to selectively vary the diaphragm or beam thickness of the micromachine element of a sensor, whether the sensor is a pressure sensor such as the sensor 10 of FIG. 1 or an accelerometer such as the capacitive accelerometer 110 of FIG. 4. Thickness of a micromachine element 54 can be selectively varied using N+ and P+ buried layers 34 and 62 because the electrochemical etch preferentially will remove the p-type silicon of the P+ buried layer 62 and leave the n-type silicon of the N+ buried layer 34, as indicated in FIG. 3b. As a result, the presence of the N+ buried layer 34 will result in a thicker section through the micromachine element 54, such that the micromachine element 54 will be better suited for sensing high pressures if the element 54 serves as a pressure sensor membrane, or high accelerations if the element 54 serves as an accelerometer beam.

In contrast, the P+ buried layer 62 will be etched away with the p-type substrate 18, resulting in a thinner micromachine element 54, such that the micromachine element 54 will be better suited for sensing lower pressures if the element 54 serves as a pressure sensor membrane, or lower accelerations if the element 54 serves as an accelerometer beam. Though not shown in FIG. 3b, the N+ diffusion 42 of FIG. 1 could also be employed to vary the thickness of the micromachine element 54.

Finally, while the above processing method is directed to the integration of a micromachining process with a bipolar process, the teachings of this invention can be extended to CMOS and BiCMOS processes as well. The differences and similarities between the bipolar process described in detail above and CMOS and BiCMOS processes integrated with the micromachining process of this invention are noted below.

For a CMOS process, processing is essentially unchanged until the diffusion isolation level, which is unnecessary for a CMOS process. Instead, a p-well is formed in the n-type epitaxial layer 16 by conventional mask and diffusion methods, including the formation of a thick field oxide layer and use of a high temperature drive to diffuse the p-type dopants to form the p-well. Furthermore, at the level at which the P+ base 30 would be formed, the gate oxide for the CMOS device is grown, followed by a polysilicon deposition and mask to form the gate for each field effect transistor of the CMOS device, and then formation of the source and drain for each field effect transistor using n-type and p-type dopants. However, as with the bipolar process, the p-type dopant is simultaneously used to form the piezoresistors for the micromachine element of the sensor. Thereafter, essentially identical processing steps can be performed to complete the fabrication of the sensor and CMOS device. Notably, the polysilicon layer can be employed to form stress isolated circuit resistors.

As with the CMOS process, integration of a BiCMOS process with the micromachining process of this invention is essentially the same as that for the bipolar process until the-P+ isolation diffusion level, at which point both p-wells and isolation diffusions are formed simultaneously. After the well drive and gate oxidation steps, the base for the bipolar device and the piezoresistors for the sensor are formed in accordance with the prior description of the bipolar process. Following deposition of the polysilicon, the N+ source and drain are formed for the n-MOS device and the emitter is formed for the bipolar device, followed by the formation of the P+ source and drain for the p-MOS device. Thereafter, essentially identical processing steps can be performed to complete the fabrication of the sensor and BiCMOS device.

From the above, it can be seen that the method of this invention teaches a bulk micromachining process which is fully integrated with bipolar processes, as well as CMOS and BiCMOS processes. More particularly, the present method is particularly adapted for forming micromachine sensing elements concurrently with bipolar processes, resulting in a fully integrated fabrication process requiring a minimal number of processing steps, while modifications of the processing steps allow the invention to be readily adapted to CMOS and BiCMOS processes as well. Additional advantages of this invention include the ability to selectively alter the thickness of the micromachine element by forming one or more buried layers in the surface of a substrate, such that the size and shape of the micromachine element can be accurately defined so as to enable the fabrication of an accurate sensing device.

It should also be noted that the method of this invention could also be employed in conjunction with the above integrated circuit processes to fabricate micromachine elements other than the pressure sensing and accelerometer devices described above. Therefore, while our invention has been described in terms of a preferred embodiment, it is apparent that other forms could be adopted by one skilled in the art. Accordingly, the scope of our invention is to be limited only by the following claims.

The embodiments of the invention in which an exclusive property or privilege is claimed are defined as follows:

1. A method for forming a one-chip integrated sensor having a micromachined sensing structure which is concurrently formed with an integrated circuit device on a single substrate, the method comprising the steps of:

forming an n-type epitaxial silicon layer on a first surface of the substrate, the epitaxial silicon layer forming an element of the integrated circuit device;

growing a first field oxide layer on the epitaxial silicon layer and a second field oxide layer on a second surface of the substrate opposite the first surface;

forming P+ regions in the epitaxial silicon layer so as to concurrently form at least one element of the integrated circuit device and a piezoresistor for the micromachined sensing structure;

forming an N+ region in the epitaxial silicon layer so as to form a second element of the integrated circuit device and an ohmic contact to the epitaxial silicon layer;

forming contacts and conductors for the micromachined sensing structure and the integrated circuit device through the first field oxide layer; and etching a cavity through the second field oxide and in the second surface of the substrate until the epitaxial silicon layer is exposed by the cavity, the micromachined sensing structure being a region of the epitaxial silicon layer that is free of metallization and buried layers.

2. A method as recited in claim 1 further comprising the step of forming an isolation diffusion in the epitaxial silicon layer and between the micromachined sensing structure and the integrated circuit device.

3. A method as recited in claim 1 wherein the substrate is a [100] p-type wafer.

4. A method as recited in claim 1 wherein the integrated circuit device is an NPN transistor, the epitaxial silicon layer forming a collector for the NPN transistor, one of the P+ regions in the epitaxial silicon layer forming a base for the NPN transistor, and the N+ region being formed in the base so as to form an emitter for the NPN transistor.

5. A method as recited in claim 1 wherein the integrated circuit device is a lateral PNP transistor, the epitaxial silicon layer forming a base for the lateral PNP transistor, a first of the P+ regions in the epitaxial silicon layer forming an emitter for the lateral PNP transistor, a second of the P+ regions in the epitaxial silicon layer forming a collector for the lateral PNP transistor, and the N+ region being formed outside the P+ regions so as to form a base contact for the lateral PNP transistor.

6. A method as recited in claim 1 further comprising the step of bonding a wafer to the second surface of the substrate so as to enclose the cavity.

7. A method as recited in claim 1 further comprising the step of forming a buried layer in the first surface of the substrate.

8. A method as recited in claim 1 wherein the buried layer is an N+ buried layer, and wherein the step of forming the cavity is restricted by the presence of the N+ buried layer.

9. A method as recited in claim 7 wherein the buried layer is a P+ buried layer, and wherein the step of forming the cavity results in the P+ buried layer being removed.

10. A method for forming a one-chip integrated sensor having a micromachined sensing structure which is concurrently formed with an integrated circuit device on a single substrate, the method comprising the steps of:

forming the substrate from a [100] p-type wafer having a first surface and an oppositely disposed second surface;

forming an n-type epitaxial silicon layer on the first surface of the substrate, the epitaxial silicon layer forming an element of the integrated circuit device;

growing a first field oxide layer on the epitaxial silicon layer and a second field oxide layer on the second surface of the substrate;

forming P+ regions in the epitaxial silicon layer so as to concurrently form at least one element of the integrated circuit device and a piezoresistor for the micromachined sensing structure;

forming an N+ region in the epitaxial silicon layer so as to form a second element of the integrated circuit device and an ohmic contact to the epitaxial silicon layer;

forming contacts and conductors for the micromachined sensing structure and the integrated circuit device through the first field oxide layer;

removing the first field oxide layer from the epitaxial silicon layer;

forming a cavity through the second field oxide and in the second surface of the substrate until the epitaxial silicon layer is exposed by the cavity such that the micromachined sensing structure consists of a region of the epitaxial silicon layer that is free of buried layers and is adjacent the piezoresistor; and bonding a wafer to the second surface of the substrate.

11. A method as recited in claim 10 further comprising the step of forming an isolation diffusion in the epitaxial silicon layer and between the micromachined sensing structure and the integrated circuit device.

12. A method as recited in claim 10 wherein the integrated circuit device is an NPN transistor, the epitaxial silicon layer forming a collector for the NPN transistor, one of the P+ regions in the epitaxial silicon layer forming a base for the NPN transistor, and the N+ region being formed in the base so as to form an emitter for the NPN transistor.

13. A method as recited in claim 10 wherein the wafer seals the cavity such that the micromachined sensing structure forms a diaphragm of an absolute pressure sensor.

14. A method as recited in claim 10 wherein the micromachined sensing structure is a proof mass of an accelerometer.

15. A method as recited in claim 14 further comprising the steps of:

forming a first metal pattern on the proof mass; and bonding a second wafer on a surface of the one-chip integrated sensor corresponding to the first surface of the substrate, the second wafer having a second metal pattern formed thereon, the first and second metal patterns forming a capacitive accelerometer.

16. A method as recited in claim 10 further comprising the step of forming a buried layer in the first surface of the substrate.

17. A method as recited in claim 16 wherein the buried layer is an N+ buried layer, and wherein the step of forming the cavity is restricted by the presence of the N+ buried layer.

18. A method as recited in claim 16 wherein the buried layer is a P+ buried layer, and wherein the step of forming the cavity results in the P+ buried layer being removed.

19. A method for forming a one-chip integrated sensor having a micromachined sensing structure which is concurrently formed with a bipolar integrated circuit device on a single substrate, the method comprising the steps of:

forming the substrate from a [100] p-type wafer having a first surface and an oppositely disposed second surface;

forming an n-type epitaxial silicon layer on the first surface of the substrate and a P+ buried layer in the first surface of the substrate, the epitaxial silicon layer forming an element of the integrated circuit device;

growing a first field oxide layer on the epitaxial silicon layer;

forming an isolation diffusion in the epitaxial silicon layer and between the micromachined sensing structure and the integrated circuit device, and forming a second field oxide layer on the second surface of the substrate;

ion implanting boron into the epitaxial silicon layer so as to concurrently form P+ regions in the epitaxial silicon layer, at least one of the P+ regions forming a first element of the bipolar integrated circuit device and a second of the P+ regions forming a piezoresistor for the micromachined sensing structure;

forming an N+ region in the epitaxial silicon layer so as to form a second element of the integrated circuit device;

forming contacts and conductors for the micromachined sensing structure and the integrated circuit device through the first field oxide layer;

forming a passivation layer over the contacts and conductors;

removing the first field oxide layer from the epitaxial silicon layer;

electrochemical etching a cavity through the second field oxide and in the second surface of the substrate so as to remove the P+ buried layer, such that the epitaxial silicon layer alone forms the micromachined sensing structure; and bonding a wafer to the second surface of the substrate so as to enclose the cavity.

* * * * *